(12) United States Patent
Li et al.

(10) Patent No.: US 7,259,055 B2
(45) Date of Patent: Aug. 21, 2007

(54) METHOD OF FORMING HIGH-LUMINESCENCE SILICON ELECTROLUMINESCENCE DEVICE

(75) Inventors: Tingkai Li, Vancouver, WA (US); Pooran Chandra Joshi, Vancouver, WA (US); Wei Gao, Vancouver, WA (US); Yoshi Ono, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 328 days.

(21) Appl. No.: 11/066,713

(22) Filed: Feb. 24, 2005

(65) Prior Publication Data
US 2006/0189014 A1 Aug. 24, 2006

(51) Int. Cl.
*H01L 21/8238* (2006.01)
(52) U.S. Cl. .......... 438/225; 438/297; 438/362; 438/425; 438/452; 438/FOR. 229; 438/FOR. 431; 257/509; 257/646; 257/E31.096; 257/E21.556; 427/248.1; 427/255.28; 427/331; 427/377
(58) Field of Classification Search .......... 438/225, 438/297, 362, 425, 452, FOR. 229, FOR. 431; 257/509, 646, E31.096, E21.556; 427/248.1, 427/255.28, 331, 377
See application file for complete search history.

(56) References Cited

U.S. PATENT DOCUMENTS 6,774,061 B2 * 8/2004 Coffa et al. ........... 438/197

2002/0110982 A1 * 8/2002 Watatani ............... 438/256
2004/0005781 A1 * 1/2004 Huang et al. .......... 438/694
2005/0287731 A1 * 12/2005 Bian et al. ............. 438/201

OTHER PUBLICATIONS

Maria E. Castagna et al. "High efficiency light emission devices in silicon." MRS fall meeting, 2002.

* cited by examiner

*Primary Examiner*—Matthew Smith
*Assistant Examiner*—Thanh Van Pham
(74) *Attorney, Agent, or Firm*—Law Office of Gerald Maliszewski; Gerald Maliszewski (57) ABSTRACT

A method for forming a high-luminescence Si electroluminescence (EL) phosphor is provided, with an EL device made from the Si phosphor. The method comprises: depositing a silicon-rich oxide (SRO) film, with Si nanocrystals, having a refractive index in the range of 1.5 to 2.1, and a porosity in the range of 5 to 20%; and, post-annealing the SRO film in an oxygen atmosphere. DC-sputtering or PECVD processes can be used to deposit the SRO film. In one aspect the method further comprises: HF buffered oxide etching (BOE) the SRO film; and, re-oxidizing the SRO film, to form a $SiO_2$ layer around the Si nanocrystals in the SRO film. In one aspect, the SRO film is re-oxidized by annealing in an oxygen atmosphere. In this manner, a layer of $SiO_2$ is formed around the Si nanocrystals having a thickness in the range of 1 to 5 nanometers (nm).

25 Claims, 6 Drawing Sheets

METHOD OF FORMING HIGH-LUMINESCENCE SILICON ELECTROLUMINESCENCE DEVICE

BACKGROUND OF THE INVENTION

1. Field of the Invention

This invention generally relates to integrated circuit (IC) fabrication and, more particularly, to an electroluminescence (EL) device with a silicon-rich oxide (SRO) film having a refractive index of about 1.72, to optimize photoluminescence (PL).

2. Description of the Related Art

The generation of light from semiconductor devices is possible, regardless of whether the semiconductor material forms a direct or indirect bandgap. High field reverse biased p-n junctions create large hot carrier populations that recombine with the release of photons. For silicon devices, the light generation efficiency is known to be poor and the photon energy is predominantly around 2 eV. The conversion of electrical energy to optical photonic energy is called electroluminescence (EL). Efficient EL devices have been made that can operate with small electrical signals, at room temperature. However, these devices are fabricated on materials that are typically not compatible with silicon, for example type III-V materials such as InGaN, AlGaAs, GaAsP, GaN, and GaP. An EL device built on one of these substrates can efficiently emit light in a narrow bandwidth within the visible region, depending on the specific material used. Additionally, type II-VI materials such as ZnSe have been used. Other type II-VI materials such as ZnS and ZnO are known to exhibit electroluminescence under ac bias conditions. These devices can be deposited onto silicon for use in light generating devices if special (non-conventional) CMOS processes are performed. Other classes of light emitting devices are organic light emitting diodes (OLEDs), nanocrystalline silicon (nc-Si), and polymer LEDs.

Silicon has conventionally been considered unsuitable for optoelectronic applications, due to the indirect nature of its energy band gap. Bulk silicon is indeed a highly inefficient light emitter. Among the different approaches developed to overcome this problem, quantum confinement in Si nanostructures and rare earth doping of crystalline silicon have received a great deal of attention. In particular, Si nanoclusters (nc) embedded in $SiO_2$ have in recent years attracted the interest of the scientific community as a promising new material for the fabrication of a visible Si-based light source. Alternatively, Er-doped crystalline Si has been extensively studied to take advantage of the radiative intra-4f shell Er transition. Room-temperature operating devices with efficiencies of around 0.05% have been achieved. The device efficiency is very low and the process temperature is very high, normally over 1100° C.

However, these pioneering efforts in creating visible luminescence emanating from porous room-temperature silicon (Si), have spurred a tremendous amount of research into using nano-sized Si to develop a Si-based light source. One widely-used method of fabricating nanocluster Si (nc-Si) is to precipitate the nc-Si out of SiOx (where x<2), producing a film using chemical vapor deposition (CVD), radio frequency (RF)-sputtering, or Si implantation. This film is often called silicon-rich silicon oxide (SRSO) or silicon-rich oxide (SRO). Using the CVD or RF-sputtering processes, with a high-temperature annealing, a photoluminescence (PL) peak in the SRSO can typically be obtained in the wavelength range of 590 nanometers (nm) to 750 nm. However, these SRSO materials exhibit low quantum efficiency and have a stability problem, which reduces the PL intensity height over time, and limits their application to EL devices.

Er implantation, creating Er-doped nanocrystal Si, is also used in Si-based light sources. However, state-of-the-art implantation processes have not been able to distribute the dopant uniformly, which lowers the light emitting efficiency and increases costs. At the same time, there has been no interface engineering sufficient to support the use of such a dopant. Using the $Si/SiO_2$ superlattice structure to control crystal size results in a slow, high-temperature deposition process that cannot simultaneously control both the Si particle size and the quality Si nanocrystal/SiO2 interface. The device efficiency is very low, which limits the device applications. In order to improve the device efficiency, a large interface area must be created between nanocrystal Si and $SiO_2$.

A simple and efficient light-emitting device compatible with silicon, and powered by a dc voltage would be desirable in applications where photonic devices (light emitting and light detecting) are necessary. Efficient silicon substrate EL devices would enable a faster and more reliable means of signal coupling, as compared with conventional metallization processes. Further, for intra-chip connections on large system-on-chip type of devices, the routing of signals by optical means is also desirable. For inter-chip communications, waveguides or direct optical coupling between separate silicon pieces would enable packaging without electrical contacts between chips. For miniature displays, a method for generating small point sources of visible light would enable simple, inexpensive displays to be formed.

It would be advantageous if a Si-based EL device could be fabricated that emitted PL with a high intensity.

It would be advantageous if a simple, easy to measure characteristic of SRO films existed, that could be used as guide to fabricate a Si EL device with optimized PL intensity.

SUMMARY OF THE INVENTION

This invention introduces a method for making a SRO thin-film with a high density of correctly-sized Si nano-particles, and a high quality $Si/SiO_2$ interface. The steps are as follows:

1. Either a low-temperature plasma-enhanced chemical vapor deposition (PECVD) with various $SiH_4$ flow rates, powers, and temperatures, or a DC sputtering process with various sputtering powers, oxygen partial pressures, and temperatures can be used to deposit SRO thin-films. The SRO thin-film has a refractive index, a measurement similar to silicon richness, of between 1.5 to 2.1, and porosity of 5 to 20%.

2. Post-annealing the as-deposited SRO thin-films at annealing temperatures from 900-1300° C. in an oxygen atmosphere, with an oxygen partial pressure of 1-10%, using strong oxidants such as $O_2$, $N_2O$, or $O_2+H_2O$, with a smaller molecule carrier gas such as He, $N_2$, Ne, or Ar. The annealing temperature and oxygen partial pressure affect the Si richness and porosity of SRO thin-films.

3. Hydrofluoric acid (HF) dip etching to refresh the $SiO_2$ layer overlying the Si nanocrystals.

SRO thin-films with a high density of correctly-sized Si nano-particles, which may alternately be understood as Si size distribution, can be made by PECVD and sputtering processes. The best quality of Si nanocrystal/SiO2 interface comes from thermal oxidation. The high temperature enhances the silicon diffusion process, and helps grow the Si nanocrystals, making the film dense with Si nanocrystals. At the same time, the thermal oxidation balances the nano-Si particle size, while improving the $SiO_2$/Si nanocrystal interface quality. The strong oxidants, the smaller-molecule carrier gas, and small porosity of the as-deposited SRO thin-films enhance the homogeneous oxidation of nano-Si particles throughout the film. Using these processes, a high-luminance SRO film can be obtained.

Accordingly, a method is provided for forming a high-luminescence Si EL phosphor. The method comprises: depositing a SRO film, with Si nanocrystals, having a refractive index in the range of 1.5 to 2.1, and a porosity in the range of 5 to 20%; and, post-annealing the SRO film in an oxygen atmosphere. As mentioned above, DC sputtering or PECVD processes can be used to deposit the SRO film. In one aspect the method further comprises: following the SRO film post-annealing, HF buffered oxide etching (BOE) the SRO film; and, re-oxidizing the SRO film, to form a $SiO_2$ layer around the Si nanocrystals in the SRO film.

In one aspect, the SRO film is dipped in a BOE:HF solution having a ratio in the range of 10:1 to 50:1, and the SRO film is re-oxidizing by annealing in an oxygen atmosphere. In this manner, a layer of $SiO_2$ is formed around the Si nanocrystals having a thickness in the range of 1 to 5 nanometers (nm). Typically, post-annealing the SRO film in an oxygen atmosphere results in a decrease in the refractive index of SRO films, oxidation of Si nanocrystals in the SRO film, and densification of the SRO film.

In another aspect, the method comprises thermal annealing the SRO film in an atmosphere void of oxygen, prior to post-annealing the SRO film in an oxygen atmosphere. Typically, thermal annealing the SRO film in an atmosphere void of oxygen increases the refractive index of the SRO film, forms Si nanocrystals in the SRO film, and densifies the SRO film.

Additional details of the above-described method, a method for optimizing the PL of a Si EL device, and a high-luminescence Si EL device are provided below.

DETAILED DESCRIPTION

Figure 1:
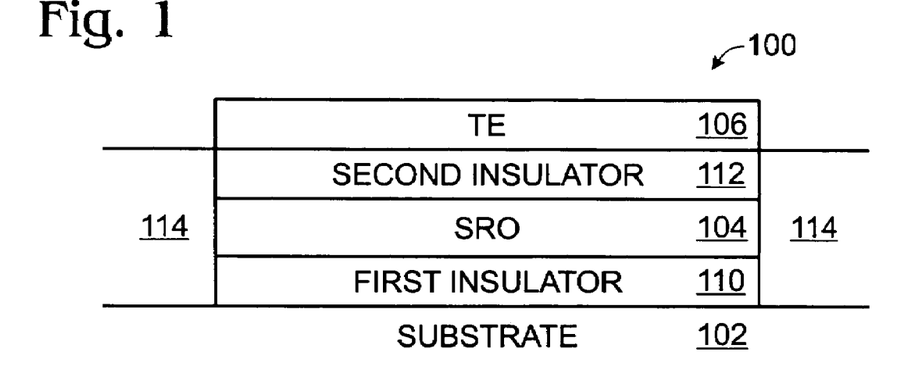
FIG. 1 is a partial cross-sectional view of a high-luminescence silicon (Si) electroluminescence (EL) device.

FIG. 1 is a partial cross-sectional view of a high-luminescence silicon (Si) electroluminescence (EL) device. In its simplest form, the EL device 100 comprises a substrate 102 and a silicon-rich oxide (SRO) film 104 overlying the substrate 102. The SRO film 104 has a refractive index in the range of 1.5 to 2.1, and a porosity in the range of 5 to 20%. A top electrode (TE) 106 overlies the SRO film 104. The index of refraction relates to the bending of light as it passes through a transparent or semi-transparent medium. Alternately stated, the index of refraction is a ratio, representing the difference in the propagation of light through a particular medium, as opposed to air. Porosity is the proportion of the non-solid volume to the total volume of material, and is defined by the ratio:

$$\phi = \frac{V_p}{V_m}$$

where $V_p$ is the non-solid volume (pores) and $V_m$ is the total volume of material, including the solid and non-solid parts. It is common to express porosity as a percentage.

Figure 2:
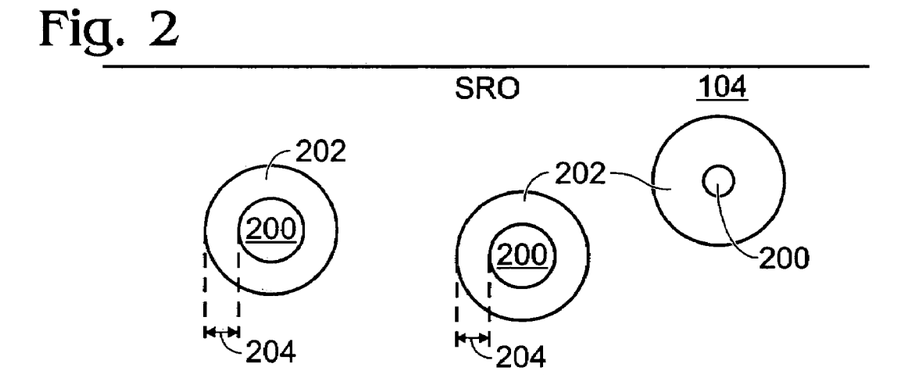
FIG. 2 is a partial cross-sectional view of a detail of the SRO film of FIG. 1.

FIG. 2 is a partial cross-sectional view of a detail of the SRO film of FIG. 1. The SRO film 104 includes Si nanocrystals 200, with a silicon dioxide ($SiO_2$) layer 202 formed around the Si nanocrystals 200 in the SRO film 104. In one aspect, the layer 202 of $SiO_2$ around the Si nanocrystal 200 has a thickness 204 in the range of 1 to 5 nanometers (nm).

Returning to FIG. 1, in one aspect as shown, a first insulator layer 110 is interposed between the substrate 102 and the SRO film 104. Also, a second insulator layer 112 can be interposed between the SRO film 104 and the top electrode 106.

The substrate 102 can be a material such as Si, N type Si, P type Si, Si glass, gallium arsenic (GaAs), silicon carbide (SiC), gallium nitride (GaN), Al2O3 (sapphire), or a temperature-sensitive material such as glass, plastic, or quartz. The top electrode 106 can be a transparent material such as indium tin oxide (ITO), ZnO, or other conductive oxides, or a thin film made from a metal such as gold. Alternately, the top electrode 106 can be a non-transparent material such as polycrystalline Si, Au, Cr, Pt, Ir, Al, AlCu, Ag, YBCO, $RuO_2$, or $La_{1-x}Sr_xCoO_3$. If the top electrode 106 is non-transparent, then light may be emitted in a "horizontal" direction through an oxide material 114 adjacent the SRO layer. Alternately, the substrate may be a transparent substrate material.

The first insulator layer 110 and second insulator layer 112 may be a material such as SiO2, HfO2, ZrO2, Ai2O3, La2O3, Si3N4, TiO2, Ta2O5, or Nb2O5. Note, the first insulator layer 110 need not be made from the same material as the second insulator layer 112.

Figure 3:
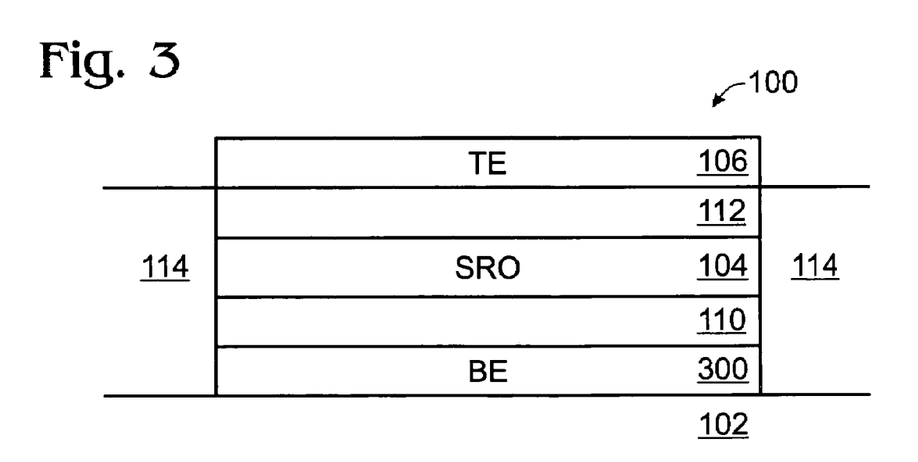
FIG. 3 is a partial cross-sectional view of a variation of the EL device of FIG. 1.

FIG. 3 is a partial cross-sectional view of a variation of the EL device of FIG. 1. In this aspect a bottom electrode 300 is interposed between the substrate 102 and the first insulator layer 110. The bottom electrode 300 may be a material such as polycrystalline Si, ITO, Au, Al, ZnO, Cr, Pt, Ir, AlCu, Ag, YBCO, $RuO_2$, or $La_{1-x}Sr_xCoO_3$. In one aspect, both the bottom electrode 300 and the substrate 102 are transparent. In another aspect, the top electrode 106 is transparent. In one other aspect not shown, the first insulator layer 110 and the second insulator layer 112 are not used.

in a 1-5% $O_2+N_2$ atmosphere. The PL properties of these samples were measured using an ACCENT RPM2000 PL measurement system. The following is the PL measurement conditions: Power: 2.5-3.0 mW, Laser: 266.0 nm, Filter: 295 nm LP, Gain: x1-16 (corr.), Scan rate: 5-200 spect/s, Split width: 0.500 mm, Grating: 300 g/mm-762, Range: 300-1000 nm, Detector: CCD BT-TE. In order to compare the PL intensity of the SRO oxides, the PL data for each of the SRO samples is normalized to standard measurement conditions and plotted for comparison.

TABLE 1

PECVD Process Conditions

| Wafer ID | $SiH_4$ Flow (sccm) | $N_2O$ flow (sccm) | $N_2$ flow (sccm) | Plasma power (W) | Dep. pressure (mTorr) | Dep. Temp (C.) | Dep. time (min.) | n | Film Thickness (Å) |
|---|---|---|---|---|---|---|---|---|---|
| 4773 | 10 | 15 | 50 | 500 | 100 | 300 | 8 | 1.61 | 2363 |
| B0E4 | 15 | 15 | 50 | 500 | 100 | 300 | 75 | 1.72 | 2606 |
| B0B1 | 20 | 15 | 50 | 500 | 100 | 300 | 6 | 1.82 | 2838 |
| B0E2 | 25 | 15 | 50 | 500 | 100 | 300 | 5 | 1.93 | 2853 |
| B0A7 | 30 | 15 | 50 | 500 | 100 | 300 | 4 | 2.05 | 2667 |

Functional Description

Processes have been developed to control the size of silicon nano-particles (SNP), which are also referred to herein a nanocrystalline (nc) Si, or Si nanocrystals. These processes also improve the quality of $SiO_2$/SNP interfaces. To illustrate the invention, examples of Si-rich oxide (SRO) films with various Si richnesses are presented that have been formed using DC-sputtering and PECVD techniques, and post-annealed at various temperatures and different atmospheres. The high-temperature annealing of SRO films with a specific range of silicon richness, corresponding to specific range of refractive indices, enhances the silicon diffusion process and promotes the growth of SNP. A thermal oxidation process oxidizes the SNPs and forms a good interface between $SiO_2$ and SNP. This interface reduces the non-radiative recombination, and significantly enhances photoluminescence intensity.

Based on the experimental results, a SRO film with good PL properties should have a refractive index in the range between 1.5 and 2.1. The post-annealing temperatures should be greater than 900° C. A thermal oxidation improves the $SiO_2$/SNP interface quality. The PECVD and DC-sputtering deposition processes, as well as the post-annealing processes can be optimized to make a SRO thin-film with the optimal PL properties.

PECVD Processes

Various PECVD deposition and annealing conditions are listed in the Tables 1, 2 and 3. Generally, Ar atmosphere annealing was performed in AET equipment, while oxygen ambient annealing was performed in MRL equipment. Fixing the other process conditions, different $SiH_4$ flow rates can be used to deposit SRO samples with various Si richnesses, or refractions indices (n). For each $SiH_4$ flow rate, five different PL measurement samples are presented: 1). Annealed at 1000° C. for 30 min in Ar (AET), 2). After annealed at 1000° C. for 30 min in Ar, and then annealed at 1100° C. for 10 min in a 1-5% $O_2+N_2$ atmosphere (MRL). 3). Annealed at 1050° C. for 30 min in a 1-5% $O_2+N_2$ atmosphere, 4). Annealed at 1050° C. for 60 min in a 1-5% $O_2+N_2$ atmosphere, and 5). Annealed at 1100° C. for 10 min

TABLE 2

AET Annealing Conditions

| AET anneal | Rapid Thermal rates | Annealing Time | atmosphere |
|---|---|---|---|
| 900° C.-1000° C. | 50-300° C./S | 10-30 min | Ar |

TABLE 3

MRL Annealing Conditions

| MRL anneal | Thermal rates | Annealing Time | atmosphere |
|---|---|---|---|
| 1050° C.-1100° C. | 0.5-5° C./S | 10-60 min | $N_2$ + 1-5% $O_2$ |

Figure 4:
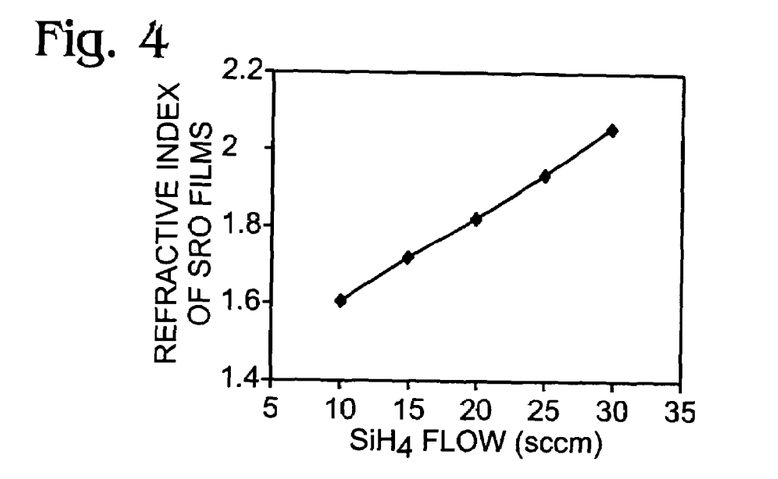
FIG. 4 is a graph depicting the refractive indices of SRO samples with various $SiH_4$ flow rates.

FIG. 4 is a graph depicting the refractive indices of SRO samples with various $SiH_4$ flow rates. The graph shows that the refractive indices of the SRO film samples changes from 1.61 to 2.05, in response to increasing the $SiH_4$ flow rates. From the literature, the refractive index of $SiO_2$ is nominally stated to be 1.46. The refractive index of SRO film increases from 1.46, to higher indices in response to increasing the Si richness. Alternately stated, the refractive index of a SRO film is a simple means of measuring Si richness in SRO materials. This simple measurement process permits greater control over Si richness, which in turn, can be used to form a SRO film with the optimal PL characteristics. FIG. 4 depicts SRO films, with various Si richnesses, deposited by a PECVD process.

Figure 5:
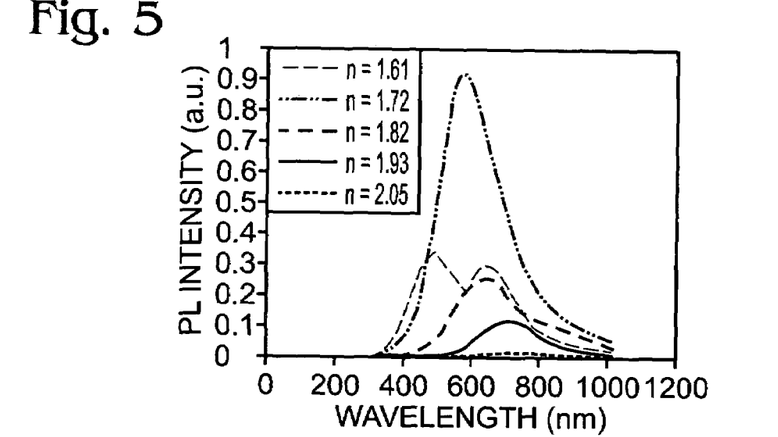
FIG. 5 is a graph depicting the PL spectrums of as-deposited SRO films with various refractive indices.

FIG. 5 is a graph depicting the PL spectrums of as-deposited SRO films with various refractive indices. In response to increasing the refractive index, the PL intensity increases, reaching a maximum value when the refractive index is 1.72. The PL intensity decreases again for refractive indices above 1.72. The PL intensity peak moves to longer wavelengths in response to increasing refractive index. After post-annealing in an Ar atmosphere, the PL intensity of SRO films having a refractive index of less than 1.72, increases in response to increasing the annealing temperatures. The high temperature enhances the silicon diffusion process and helps grow the Si nano-particles. However, after post-annealing in an 1-5% $O_2+N_2$ atmosphere, the PL intensity of SRO films with low refractive index (<1.72), decreases in response to increasing the annealing temperatures. The reason is due to the oxidation of Si nano-particles, resulting in reduced number of Si nano-particles. The PL intensity of SRO samples with a high refractive index (>1.72) decreases in response to increasing annealing temperatures in an Ar atmosphere, due to the growth in the size of the Si nano-particles. But the PL intensity of SRO films with a high refractive index (>1.72) increases in response to increasing annealing temperatures in a 1-5% $O_2+N_2$ atmosphere. The reason is that the thermal oxidation of Si nano-particles improves the $SiO_2$/SNP interface quality and reduces the size of Si nano-particles, thus enhancing the PL properties.

Figure 6:
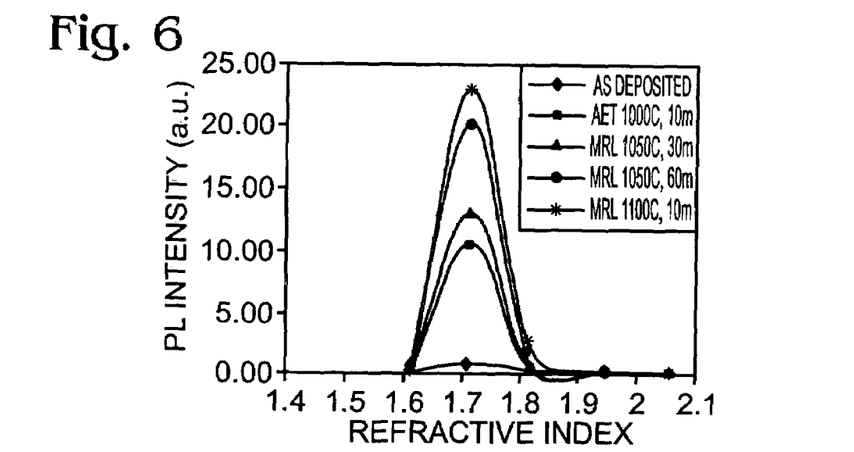
FIGS. 6 and 7 are graphs depicting PL intensity measured with respect to various annealing conditions.
Figure 7:
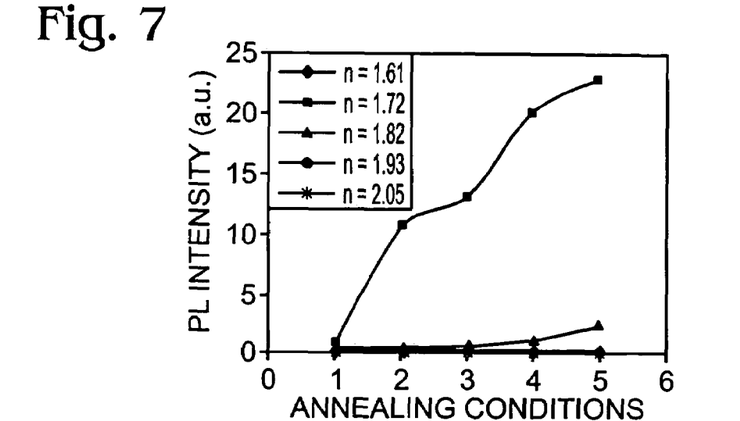

FIGS. 6 and 7 are graphs depicting PL intensity measured with respect to various annealing conditions. Specifically, FIG. 6 shows the PL intensity of SRO films with various refractive indices after post-annealing. FIG. 7 depicts the PL intensity of SRO films with various post-annealing conditions. A very good PL intensity is obtained from a SRO film with refractive index of about 1.72, after 1100° C. annealing in a 1-5% $O_2+N_2$ atmosphere. Comparing as-deposited vs. 1100° C. oxygen ambient annealing data, the effects of annealing temperature and thermal oxidation can be seen. When temperature increases from the as-deposited temperature of 300° C., to 1100° C. in 1-5% $O_2+N_2$ atmosphere, the PL intensity increases significantly, by over 25 times, for an SRO film with a refractive index of around 1.72. This effect is likely due to the combination of improved interface quality and an increased amount of Si nano-particles formed as a result of higher temperature annealing and oxidation.

Figure 8:
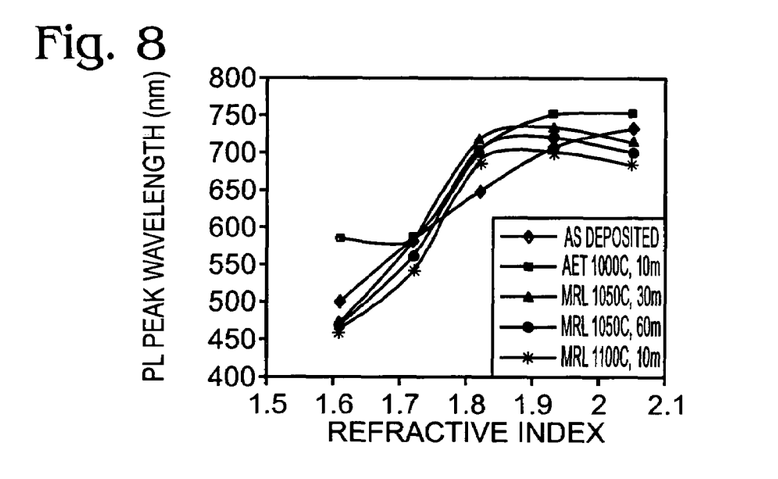
FIG. 8 is a graph depicting the PL wavelength of SRO films with various refractive indices.

FIG. 8 is a graph depicting the PL wavelength of SRO films with various refractive indices. The literature conventionally understands the PL peak wavelength of SRO films to increase in response to increasing the grain size of nano-Si particles. In FIG. 8 it can be seen that the PL peak of most SRO films moves to longer wavelengths, in response to increasing refractive indices with various annealing conditions. This effect can be attributed to the bigger crystal sizes associated with increasing Si richness, which enhances the growth of Si particles.

Figure 9:
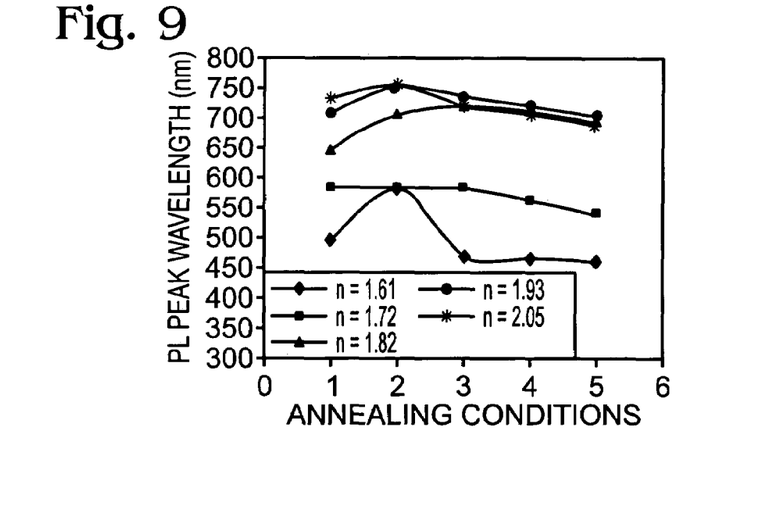
FIG. 9 is a graph depicting the PL peak wavelength of SRO films with various refractive indices and different annealing conditions.

FIG. 9 is a graph depicting the PL peak wavelength of SRO films with various refractive indices and different annealing conditions. After annealing at 1000° C. in Ar, the PL peaks of most SRO films shift to a longer wavelength due to the growth of Si particles. However, the SRO samples show a different behavior after annealing at 1050-1100° C. for 10-60 minutes in 1-5% $O_2+N_2$ atmosphere. This effect is due to both temperature and oxygen oxidation. High temperature enhances the silicon diffusion process and helps promote the growth of Si nano-particles. On the other hand, the oxygen oxidation improves the $SiO_2$/SNP interface quality, and reduces the Si nano-particle size. The final result is dependent upon the dominant effect. The PL peaks of SRO samples with a lower refractive index (<1.72) move to shorter wavelengths after annealing in oxygen. That is, the Si NP size is more dependent upon the effects of thermal oxidation, than upon high temperature. The PL peaks of SRO samples with a higher refractive index (>1.72) move to a longer wavelength after annealing at 1050° C. for 30 minutes in oxygen. Then, the wavelength shifts back to a shorter wavelength after thermal (oxygen) annealing at 1050° C. for 60 min, or at 1100° C. for 10 min. This behavior shows that Si particle size is chiefly dependent upon the effects of thermal oxidation, as opposed to temperature.

Figure 10:
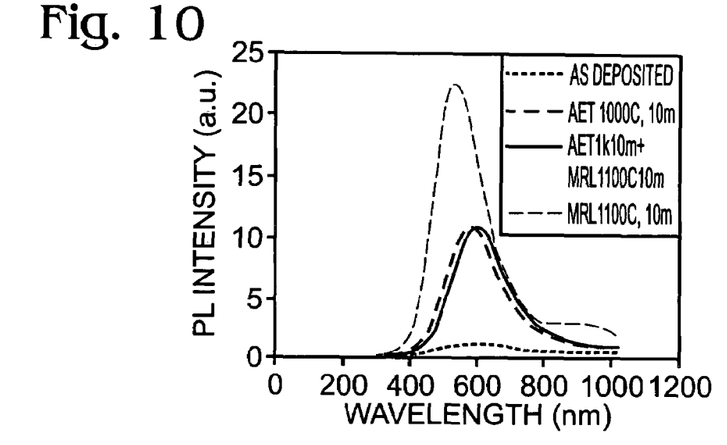
FIG. 10 is a graph depicting the PL properties of SRO films after two-step and one-step oxygen annealing processes.

FIG. 10 is a graph depicting the PL properties of SRO films after two-step and one-step oxygen annealing processes. In order to find the process conditions needed to create SRO films with high PL properties, a two-step annealing process (1000° C., 10 min in Ar+1100° C., 10 min in a 1-5% $O_2+N_2$ atmosphere) was compared to a one-step annealing process (1100° C., 10 min in a 1-5% $O_2+N_2$ atmosphere).

Figure 11:
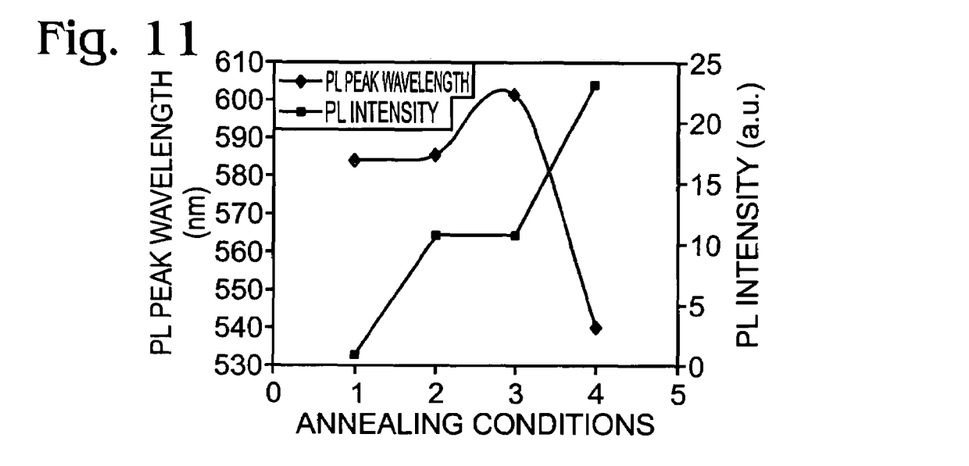
FIG. 11 is a graph depicting the PL intensity and PL peak wavelength of SRO films after two-step and one-step annealings.

FIG. 11 is a graph depicting the PL intensity and PL peak wavelength of SRO films after two-step and one-step annealings. With respect to the two-step annealing process, the first step of annealing in Ar enhances the silicon diffusion process, promotes the growth of SNP, and densifies the film. The thermal oxidation occurring as a result of the second step oxygen annealing has a limited effect upon SNP in the dense SRO film. Here, the temperature effect is dominant. Therefore, the PL intensity does not change, the PL peak only shifts to longer wavelength after the second step of oxygen annealing, as shown in the FIG. 10. For the one-step oxygen annealing process, the high temperature enhances the silicon diffusion process and promotes the growth of SNP. At the same time, the thermal oxidation balances the nano-Si particle size, while improving the $SiO_2$/SNP interface quality. That is, the thermal annealing increases the nano-Si particle size, but the oxidation reduces the nano-Si particle size. In this way, the PL peak of the SRO film moves to a shorter wavelength, of about 540 nm, and the PL intensity increases significantly.

In summary, by fixing the other process conditions, SRO samples with various Si richnesses can be deposited by using different $SiH_4$ flow rates. In order to make SRO films with excellent PL properties, the refractive index should be controlled between 1.5 and 2.1. Post-annealing processes in Ar or N2 carrier gases can improve the PL properties of SRO films. The appropriate annealing temperatures and atmospheres to be used are dependent upon the refractive index of the as-deposited SRO films. Control over annealing temperature, oxygen partial pressures, and refractive indices can be used to obtain SRO films with optimal PL properties.

DC-Sputtering

Figure 12:
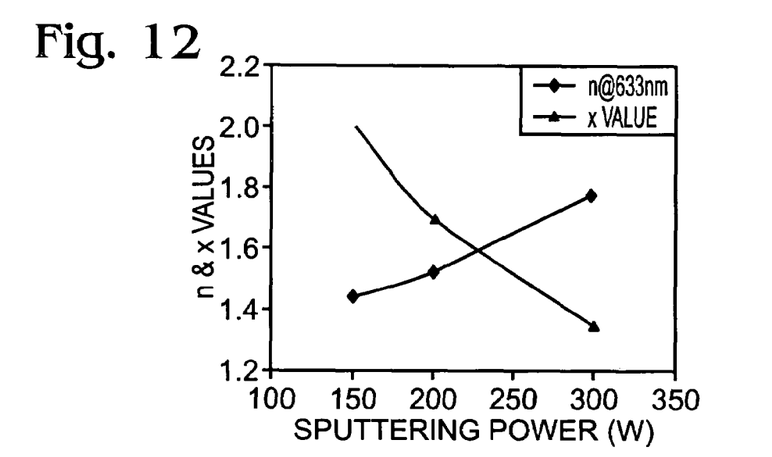
FIG. 12 is a graph depicting the silicon richness (refractive index) and optical properties of as-deposited SRO material as characterized by Rutherford backscattering (RBS) and spectroscopic ellipsometry measurements.

FIG. 12 is a graph depicting the silicon richness (refractive index) and optical properties of as-deposited SRO material as characterized by Rutherford backscattering (RBS) and spectroscopic ellipsometry measurements. The DC-sputtering of SRO films can be accomplished using an Edwards 360 system, with a 4-inch silicon target, at around 250° C., using a 15% $O_2$ in Ar gas mixture. Silicon richness is controlled in a range from 10% to 50% by changing the sputtering power. The FIGURE shows material properties at different sputtering powers. The value "x", in SiOx, represents the silicon richness of a material as measured by RBS. Refractive index (n) is inversely proportional to the x value in the range of the measurement. Detailed deposition process conditions are presented in Table 4, and post-annealing conditions are presented in Tables 2 and 3, above.

TABLE 4

DC-sputtering Process Conditions

| Target | Power (W) | Deposition temp. | Deposition pressure | Atmosphere | Deposition time |
|---|---|---|---|---|---|
| Si | 100-300 | 20-300° C. | 2-10 mTorr | Ar or N2 with 2-30% $O_2$ | Depending on required thickness |

Figure 13:
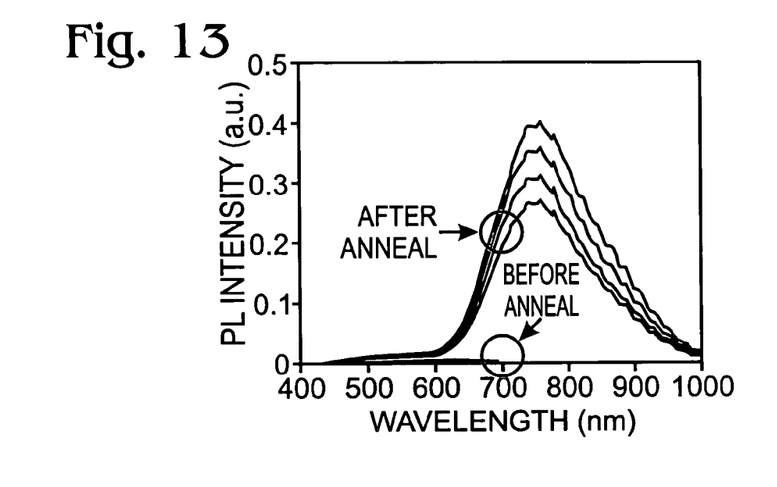
FIG. 13 is a graph depicting PL intensity enhancement after annealing at 1050° C. for 30 minutes in a 1-5% $O_2+N_2$ atmosphere.

FIG. 13 is a graph depicting PL intensity enhancement after annealing at 1050° C. for 30 minutes in a 1-5% $O_2+N_2$ atmosphere. Before annealing, the SRO sample has a PL level about equal to the noise floor. After annealing, the PL intensity is increased by 2.5 orders of magnitude. At this level, the emitted light is visible by naked eye. The PL measurements are taken on an SRSO sample with 50% silicon richness. The four measurements are taken at different spot on the sample to obtain an average.

Figure 14:
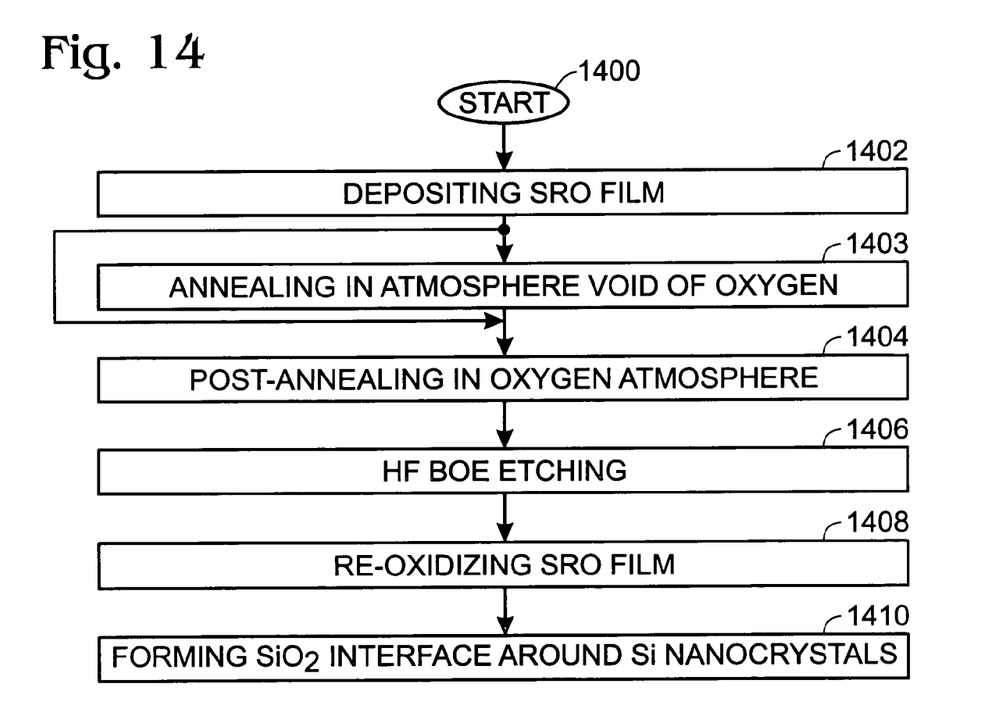
FIG. 14 is a flowchart illustrating a method for forming a high-luminescence Si EL phosphor.

FIG. 14 is a flowchart illustrating a method for forming a high-luminescence Si EL phosphor. Although the method is depicted as a sequence of numbered steps for clarity, the ordering of the steps does not necessarily follow the numbering. It should be understood that some of these steps may be skipped, performed in parallel, or performed without the requirement of maintaining a strict order of sequence. Some details of the method may be better understood in context of the explanations of FIGS. 1-13, above. The method starts at Step 1400.

Step 1402 deposits a SRO film with Si nanocrystals (or SNP), having a refractive index in the range of 1.5 to 2.1 and a porosity in the range of 5 to 20%. Step 1404 post-anneals the SRO film in an oxygen atmosphere. Following the SRO film post-annealing, Step 1406 HF BOE etches the SRO film. Step 1408 re-oxidizes the SRO film. Step 1410 forms a $SiO_2$ layer around the Si nanocrystals in the SRO film, in response to the re-oxidation.

In one aspect, HF BOE etching the SRO film (Step 1406) includes dipping the SRO film in BOE:HF solution having a ratio in the range of 10:1 to 50:1, and re-oxidizing the SRO film (Step 1408) includes annealing in an oxygen atmosphere. Then, forming the $SiO_2$ layer around the Si nanocrystals in Step 1410 includes forming a layer of $SiO_2$ around the Si nanocrystals having a thickness in the range of 1 to 5 nanometers (nm).

In another aspect, depositing the SRO film in Step 1402 includes using a low temperature PECVD process. Then, Step 1402 increases the SRO refractive index in response to increasing the $SiH_4$ flow rate; and, increases the SRO refractive index and reduces the porosity, in response to increasing the deposition temperature.

More specifically, using the PECVD process to deposit the SRO film includes: introducing $SiH_4$ at a flow rate in the range of 5 to 30 sccm; introducing $N_2O$ at a flow rate in the range of 10 to 50 sccm; using a plasma power in the range of 50 to 700 watts (W); using a deposition pressure in the range of 20 to 100 milliTorr (mTorr); using a deposition temperature in the range of 20 to 300° C.; using a deposition time in the range of 3 to 120 minutes; introducing $H_2$ at a flow rate in the range of 20 to 200 sccm; and, forming a SRO film thickness in the range of 500 to 30,000 Å. In response to increasing the $N_2O$ flow rate, the SRO index of refraction decreases. In response to increasing the $H_2$ flow rate, both the SRO refractive index and the porosity increase. In response to increasing the plasma power, the SRO refractive index decreases.

In one aspect, post-annealing the SRO film in an oxygen atmosphere (Step 1404) includes annealing at a temperature in the range of 900 and 1300° C., in an atmosphere with an oxygen partial pressure in the range of 1 to 10%, using a oxidant such as $O_2$, $N_2O$, or $O_2+H_2O$, with a carrier gas such as He, $N_2$, Ne, or Ar, for a duration in the range of 10 to 60 minutes. Generally, Step 1404 decreases the refractive index of SRO films, oxidizes Si nanocrystals in the SRO film, and densifies the SRO film.

In another aspect Step 1403, prior to post-annealing the SRO film in an oxygen atmosphere (Step 1404), thermally anneals the SRO film in an atmosphere void of oxygen. Generally, thermal annealing the SRO film in an atmosphere void of oxygen increases the refractive index of the SRO film, forms Si nanocrystals in the, SRO film, and densifies the SRO film. For example, Step 1403 may involve annealing in an Ar atmosphere, at a temperature in the range of 900 to 1300° C., for a duration in the range of 10 to 60 minutes.

In a different aspect Step 1402 deposits the SRO film with a DC-sputtering process as follows: using a Si target; using a power in the range of 100 to 300 W; using a deposition temperature in the range of 20 to 300° C.; using a deposition pressure in the range of 2 to 10 mTorr; using a atmosphere of 2 to 30% $O_2$, with a gas such as Ar or $N_2$. The SRO refractive index and porosity decrease in response to increasing the deposition temperature. The SRO refractive index and porosity decrease in response to increasing the percentage of oxygen in the atmosphere. Further, the SRO film refractive index increases in response to increasing the DC sputtering power.

Figure 15:
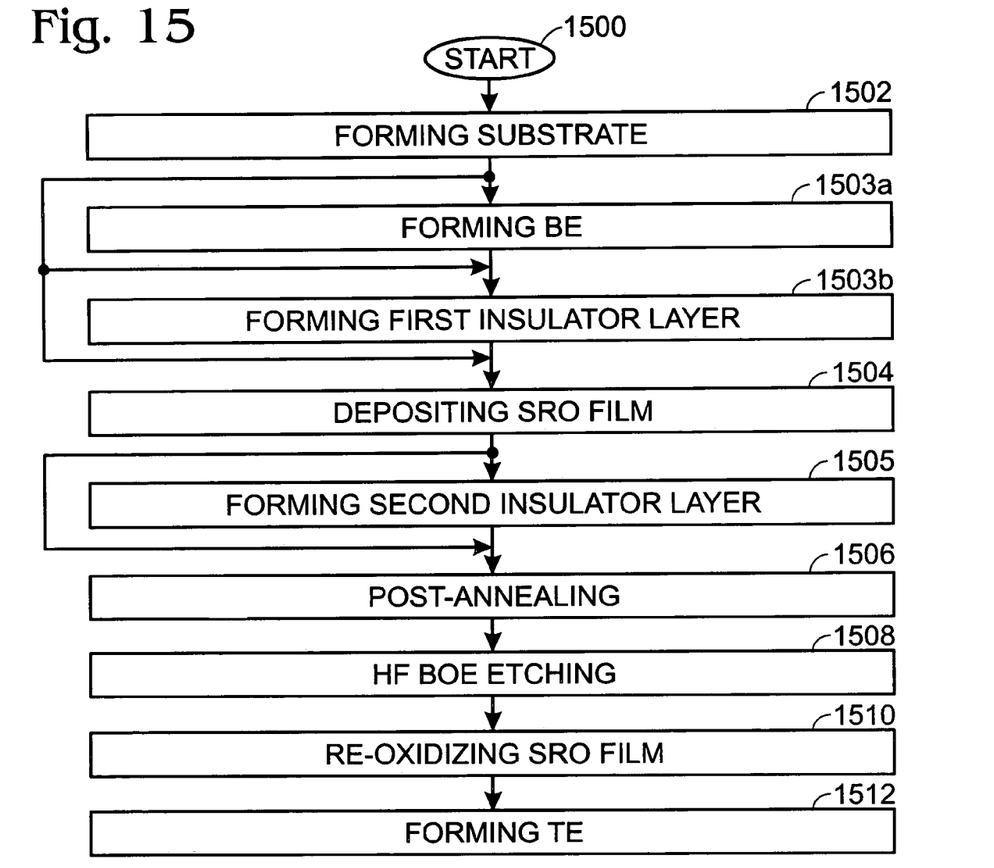
FIG. 15 is a flowchart illustrating a method for forming a high-luminescence Si EL device.

FIG. 15 is a flowchart illustrating a method for forming a high-luminescence Si EL device. The method begins at Step 1500. Step 1502 forms a substrate from a material such as Si, N type Si, P type Si, Si glass, gallium arsenic (GaAs), silicon carbide (SiC), gallium nitride (GaN), Al2O3 (sapphire), or a temperature-sensitive material such as glass, plastic, or quartz. Step 1504 deposits a SRO film overlying the substrate, having a refractive index in the range of 1.5 to 2.1, and a porosity in the range of 5 to 20%. Step 1506 post-anneals the SRO film in an oxygen atmosphere. Step 1508 HF BOE etches the SRO film. Step 1510 re-oxidizes the SRO film. Step 1512 forms a top electrode overlying the SRO film. The top electrode can be a material such as polycrystalline Si, ITO, Au, Al, ZnO, Cr, Pt, Ir, AlCu, Ag, YBCO, $RuO_2$, or $La_{1-x}Sr_xCoO_3$, to name a few examples. See the explanation of FIG. 1, above.

In one aspect Step 1503b forms a first insulator layer interposed between the substrate and the SRO film. Further, the method may also include Step 1505, of forming a second insulator layer interposed between the SRO film and the top electrode. The first and second insulator may be a material such as SiO2, HfO2, ZrO2, Ai2O3, La2O3, Si3N4, TiO2, Ta2O5, or Nb2O5.

In another variation, Step 1503a forms a bottom electrode interposed between the substrate and the first insulator layer. The bottom electrode can be transparent, or not, made from a material such as polycrystalline Si, ITO, Au, ZnO, Cr, Pt, Ir, Al, AlCu, Ag, YBCO, $RuO_2$, or $La_{1-x}Sr_xCoO_3$. See the explanation of FIG. 3, above.

Figure 16:
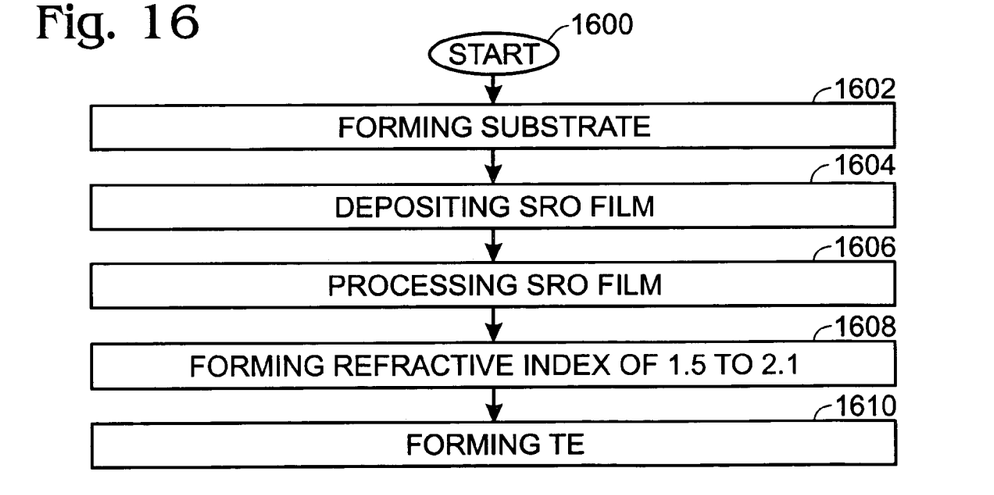
FIG. 16 is a flowchart illustrating a method for optimizing the photoluminescence (PL) of a Si EL device.

FIG. 16 is a flowchart illustrating a method for optimizing the photoluminescence (PL) of a Si EL device. The method starts at Step 1600. Step 1602 forms a substrate. Step 1604 deposits a SRO film overlying the bottom substrate. Step 1606 processes the SRO film. Step 1608 forms a SRO film with a refractive index in the range of 1.5 to 2.1, in response to the processing the SRO film. In one aspect, the SRO film has a refractive index of about 1.72. Step 1610 forms a top electrode overlying the SRO film.

In one aspect, processing the SRO film in Step 1606 includes: post-annealing the SRO film in an oxygen atmosphere; HF BOE etching the SRO film; and, annealing the SRO film in an oxygen atmosphere.

In another aspect, depositing the SRO film in Step 1604 includes using a low temperature PECVD process to deposit the SRO film, and Step 1606 processes the SRO film by varying the $SiH_4$ flow rate, the deposition temperature, the plasma power, the $H_2$ flow rate, and the $N_2O$ flow rate of the PECVD process.

In a different aspect, Step 1606 processes the SRO film by thermal annealing the SRO film in an atmosphere void of oxygen, prior to post-annealing the SRO film in an oxygen atmosphere.

In another aspect, depositing the SRO film in Step 1604 includes DC-sputtering the SRO film. Then, processing the SRO film in Step 1606 includes varying the deposition temperature, the oxygen partial pressure, and the sputtering power of the DC-sputtering process.

A SRO film fabrication process, which is controlled to achieve a particular range of refractive indices, has been presented along with an EL device made from such an SRO film. A few examples of specific materials, environmental conditions, and temperatures have been given to illustrate the invention. However, the invention is not limited to merely these examples. Other variations and embodiments will occur to those skilled in the art.

We claim:

1. A method for forming a high-luminescence silicon (Si) electroluminescence (EL) phosphor, the method comprising:
   depositing a silicon-rich oxide (SRO) film having a refractive index in the range of 1.5 to 2.1, and a porosity in the range of 5 to 20%; and
   post-annealing the SRO film in an oxygen atmosphere to obtain the high-luminance SRO film.

2. The method of claim 1 wherein depositing the SRO film includes depositing a SRO film with Si nanocrystals;
   the method further comprising:
   following the SRO film post-annealing, hydrofluoric acid (HF) buffered oxide etch (BOE) etching the SRO film; and
   re-oxidizing the SRO film; and
   in response to the re-oxidation, Lorning a silicon dioxide ($SiO_2$) layer around the Si nanocrystals in the SRO film.

3. The method of claim 2 wherein HF BOE etching the SRO film includes clipping the SRO film in BOE:HF solution having a ratio in the range of 10:1 to 50:1;
   wherein re-oxidizing the SRO film includes annealing in an oxygen atmosphere; and
   wherein forming the $SiO_2$ layer around the Si nanocrystals includes forming a layer of $SiO_2$ around the Si nanocrystals having a thickness in the range of 1 to 5 nanometers (nm).

4. The method of claim 1 wherein depositing the SRO film includes:
   using a low temperature plasma-enhanced chemical vapor deposition (PECVD) process;
   increasing the SRO refractive index in response to increasing a $SiH_4$ flow rate; and
   increasing the SRO refractive index and reducing the porosity in response to increasing deposition temperature.

5. The method of claim 4 wherein using a PECVD) process to deposit the SRO film includes:
   introducing $SiH_4$ at a flow rate in the range of 5 to 30 sccm;
   introducing $N_2O$ at a flow rate in the range of 10 to 50 sccm;
   using a plasma power in the range of 50 to 700 watts (W);
   using a deposition pressure in the range of 20 to 100 milliTorr (mTorr);
   using a deposition temperature in the range of 20 to 300° C.;
   using a deposition time in the range of 3 to 120 minutes;
   introducing $H_2$ at a flow rate in the range of 20 to 200 sccm;
   forming a SRO film thickness in the range of 500 to 30,000 Å;
   in response to increasing the $N_2$ flow rate, decreasing the SRO index of refraction;
   in response to increasing the $H_2$ flow rate, increasing the SRO refractive index and the porosity; and
   in response to increasing the plasma power, decreasing the SRO refractive index.

6. The method of claim 1 wherein post-annealing the SRO film in an oxygen atmosphere includes annealing at a temperature in the range of 900 and 1300° C., in an atmosphere with an oxygen partial pressure in the range of 1 to 10%, using a oxidant selected from the group including $O_2$, $N_2O$, $O_2+H_2O$, with a carrier gas selected from the group including He, $N_2$, Ne, and Ar, for a duration in the range of 10 to 60 minutes.

7. The method of claim 1 wherein post-annealing the SRO film in an oxygen atmosphere includes:
   decreasing the refractive index of SRQ films;
   oxidizing Si nanocrystals in the SRO film; and
   densifying the SRO film.

8. The method of claim 1 further comprising:
   prior to poet-annealing the SRO film in an oxygen atmosphere, thermal annealing the SRO film in an atmosphere void of oxygen.

9. The method of claim 8 wherein thermal annealing the SRO film in an atmosphere void of oxygen includes:
   increasing the refractive index of the SRO film;
   forming Si nanocrystals in the SRO film; and
   densifying the SRO film.

10. The method of claim 8 wherein thermal annealing the SRO film in an atmosphere void of oxygen includes annealing in an Ar atmosphere, at a temperature in the range of 900 to 1300° C., for a duration in the range of 10 to 60 minutes.

11. The method of claim 1 wherein depositing the SRO film includes DC-sputtering as follows:
    using a Si target;
    using a power in the range of 100 to 300 W;
    using a deposition temperature in the range of 20 to 300° C.;
    using a deposition pressure in tile range of 2 to 10 mTorr;
    using a atmosphere of 2 to 30% $O_2$, with a gas selected from the group including Ar and $N_2$;
    decreasing the SRO refractive index and porosity in response to increasing the deposition temperature; and
    decreasing the SRO refractive index and porosity in response to increasing the percentage of oxygen in the atmosphere.

12. The method of claim 11 wherein DC-sputtering the SRO film includes increasing the refractive index in response to increasing the DC-sputtering power.

13. A method for forming a high-luminescence silicon (Si) electroluminescence (EL) device, the method comprising:
    forming a substrate;
    depositing a silicon-rich oxide (SRO) film overlying the substrate, having a refractive index in the range of 1.5 to 2.1, and a porosity in the range of 5 to 20%;
    post-annealing the SRO film in an oxygen atmosphere to obtain the high-luminance SRO film;
    hydrofluoric acid (HF) buffered oxide etch (BOE) etching the SRO film;
    re-oxidizing the SRO film; and
    forming a top electrode overlying the SRO film.

14. The method of claim 13 further comprising:
forming a first insulator layer interposed between the substrate and the SRO film; and
forming a second insulator layer interposed between the SRO film and the top electrode.

15. The method of claim 14 wherein providing the substrate includes providing a substrate material selected from the group including Si, N type Si, P type Si, Si glass, gallium arsenic (GaAs), silicon carbide (SiC), gallium nitride (GaN), Al2O3 (sapphire), and temperature-sensitive materials selected from the group including glass, plastic, and quartz.

16. The method of claim 14 further comprising:
forming a bottom electrode interposed between the substrate and the first insulator layer.

17. The method of claim 16 wherein forming the bottom electrode includes forming the bottom electrode from a material selected from the group of polycrystalline Si, indium tin oxide (ITO), gold (Au), aluminum (Al), zinc oxide (ZnO), chromium (Cr), Pt, Ir, AlCu, Ag, YBCO, $RuO_2$, and $La_{1-x}Sr_xCoO_3$.

18. The method of claim 13 wherein forming the top electrode includes forming a top electrode from a material selected from the group including polycrystalline Si, ITO, Au, AL, ZnO, Cr, Pt, Ir, ALCu, Ag, YBCO, $RuO_2$, and $La_{1-x}Sr_xCoO_3$.

19. The method of claim 14 wherein forming the first and second insulator layers includes forming first and second insulator layers from a material selected from the group of SiO2, HfO2, ZrO2, Ai2O3, La2O3, Si3N4, TiO2, Ta2O5, and Nb2O5.

20. A method for optimizing the photoluminescence (PL) of a silicon (Si) electroluminescence (EL) device, the method comprising:
forming a bottom substrate;
depositing a silicon-rich oxide (SRO) film overlying the bottom substrate;
processing the SRO film to obtain the high-luminance SRO film;
in responce to the processing the SRO film, forming a SRO film with a refractive index in the range of 1.5 to 2.1; and
forming a top electrode overlying the SRO film.

21. The method of claim 20 wherein processing the SRO film includes:
post-annealing the SRO film in an oxygen atmosphere;
hydrofluoric acid (HF) buffered oxide etch (BOE) etebing the SRO film; and
annealing the SRO film in an oxygen atmosphere.

22. The method of claim 21 wherein depositing the SRO film includes using a low temperature plasma-enhanced chemical Vapor deposition (PECVD) process to deposit the SRO film; and
wherein processing the SRO film includes varying the $SiH_4$ flow rate, the deposition temperature, the plasma power, the $H_2$ flow rate, the $N_2O$ flow rate of the PECVD process.

23. The method of claim 21 wherein processing the SRO film includes thermal annealing the SRO film in an atmosphere void of oxygen prior to post-annealing the SRO film in an oxygen atmosphere.

24. The method of claim 21 wherein depositing the SRO film includes DC sputtering the SRO film; and
wherein processing the SRO film includes varying the deposition temperature, the oxygen partial pressure, and the sputtering power of the DC sputtering process.

25. The method of claim 20 wherein forming the SRO film with a refractive index in the range of 1.5 to 2.1 includes forming a SRO film with a refractive index of about 1.72.

* * * * *